(12) United States Patent
Yokoyama et al.

(10) Patent No.: US 8,231,961 B2
(45) Date of Patent: Jul. 31, 2012

(54) LOW TEMPERATURE CO-FIRED CERAMIC MATERIAL, LOW TEMPERATURE CO-FIRED CERAMIC BODY, AND MULTILAYER CERAMIC SUBSTRATE

(75) Inventors: Tomoya Yokoyama, Nagaokakyo (JP); Yuzo Kawada, Nagaokakyo (JP); Akira Baba, Nagaokakyo (JP); Hiromichi Kawakami, Nagaokakyo (JP); Isao Kato, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/906,336

(22) Filed: Oct. 18, 2010

(65) Prior Publication Data
US 2011/0091686 A1  Apr. 21, 2011

(30) Foreign Application Priority Data
Oct. 20, 2009 (JP) ................. 2009-241100

(51) Int. Cl.
*H05K 1/09* (2006.01)

(52) U.S. Cl. ............ 428/210; 174/258; 501/32; 501/55; 501/68; 501/103; 501/126; 156/89.11; 156/89.12

(58) Field of Classification Search ............... 428/210; 501/123, 125, 128, 32, 55, 68, 103, 126; 174/258; 156/89.11, 89.12
See application file for complete search history.

(56) References Cited

U.S. PATENT DOCUMENTS

| | | | | |
|---|---|---|---|---|
| 5,298,330 A * | 3/1994 | Stadnicar et al. | ............ | 428/432 |
| 5,336,301 A * | 8/1994 | Tani et al. | ............ | 106/1.18 |
| 5,397,830 A * | 3/1995 | Shaikh et al. | ............ | 524/494 |
| 5,714,246 A * | 2/1998 | Shaikh et al. | ............ | 428/323 |
| 5,985,461 A | 11/1999 | Tani et al. | | |
| 6,335,077 B1 * | 1/2002 | Tani et al. | ............ | 428/138 |
| 6,379,805 B1 * | 4/2002 | Oobuchi et al. | ............ | 428/446 |
| 7,009,114 B2 * | 3/2006 | Urakawa et al. | ............ | 174/250 |
| 7,030,048 B2 * | 4/2006 | Cho et al. | ............ | 501/69 |
| 7,211,533 B2 * | 5/2007 | Kawada et al. | ............ | 501/128 |
| 7,740,725 B2 * | 6/2010 | Ollivier et al. | ............ | 156/89.12 |
| 7,847,197 B2 * | 12/2010 | Oikawa et al. | ............ | 174/262 |
| 2010/0139957 A1 | 6/2010 | Motoya et al. | | |

FOREIGN PATENT DOCUMENTS

| | | |
|---|---|---|
| JP | 02-296774 A | 12/1990 |
| JP | 10-172345 A | 6/1998 |
| JP | 2002-037661 A | 2/2002 |
| JP | 2004-345928 A | 12/2004 |
| JP | 2006-001755 A | 1/2006 |
| JP | 2008-044829 A | 2/2008 |
| JP | 2008-297178 A | 12/2008 |
| JP | 2010-034176 A | 2/2010 |
| WO | WO-2009-025156 A1 | 2/2009 |

OTHER PUBLICATIONS

JPO Office Action (in Application No. 2009-241100), mailed Jan. 31, 2012.

* cited by examiner

*Primary Examiner* — Cathy Lam
(74) *Attorney, Agent, or Firm* — Dickstein Shapiro LLP

(57) ABSTRACT

A low temperature co-fired ceramic material includes a $SiO_2$—$BaO$—$Al_2O_3$-based primary component, and, as secondary components, 0.044 to 0.077 parts by weight of iron in terms of $Fe_2O_3$ and 0.30 to 0.55 parts by weight of zirconium in terms of $ZrO_2$ relative to 100 parts by weight of the $SiO_2$—$BaO$—$Al_2O_3$-based primary component. The $SiO_2$—$BaO$—$Al_2O_3$-based primary component preferably includes 47% to 60% by weight of $SiO_2$, 20% to 42% by weight of $BaO$, and 5% to 30% by weight of $Al_2O_3$.

10 Claims, 1 Drawing Sheet

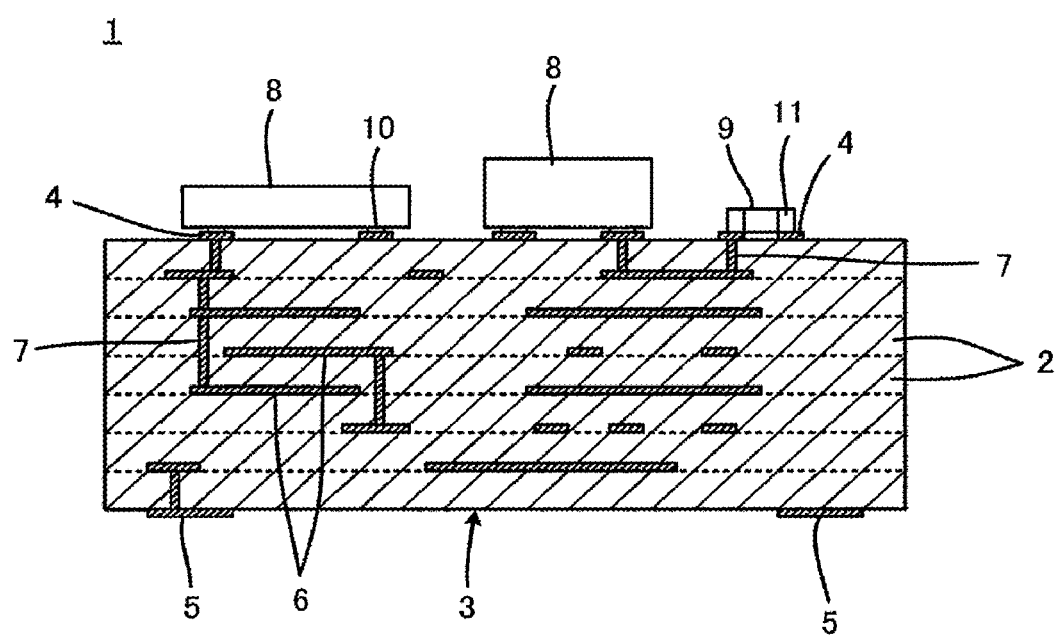

US 8,231,961 B2

LOW TEMPERATURE CO-FIRED CERAMIC MATERIAL, LOW TEMPERATURE CO-FIRED CERAMIC BODY, AND MULTILAYER CERAMIC SUBSTRATE

BACKGROUND OF THE INVENTION

1. Field of the Invention

The present invention relates to a low temperature co-fired ceramic material, a low temperature co-fired ceramic body, and a multilayer ceramic substrate. More particularly, the invention relates to improvements for suppressing variation in sinterability of a low temperature co-fired ceramic material.

2. Description of the Related Art

A $SiO_2$—$BaO$—$Al_2O_3$-based low temperature co-fired ceramic material is known as an electrical insulation material used for multilayer ceramic substrates. This material can be co-fired with a metal material that has low resistivity, such as copper, and has high insulation resistance and a low dielectric constant, thus being useful, in particular, as a substrate material used for electronic component modules for radio frequency applications.

In order to improve various properties, additives are added to the $SiO_2$—$BaO$—$Al_2O_3$-based low temperature co-fired ceramic material. For example, as disclosed in Japanese Unexamined Patent Application Publication No. 2004-345928 (Patent Document 1) and Japanese Unexamined Patent Application Publication No. 2008-44829 (Patent Document 2), Zr may be added thereto as an additive.

It is disclosed in paragraph [0029], etc. of Patent Document 1 that, by adding an appropriate amount of zirconium, a dense ceramic sintered body having good sinterability and a high Q value can be obtained. Furthermore, it is disclosed in paragraph [0074], etc. of Patent Document 2 that, by adding an appropriate amount of zirconium, a high bending strength and a high Qf value can be obtained.

However, the $SiO_2$—$BaO$—$Al_2O_3$-based low temperature co-fired ceramic material has a problem in that, in particular, when multilayer ceramic substrates are industrially manufactured using this ceramic material as a raw material, a variation in quality (in particular, sinterability) easily occurs between raw material lots.

SUMMARY OF THE INVENTION

It is an object of the present invention to provide a low temperature co-fired ceramic material that can solve the problem described above, a low temperature co-fired ceramic body obtained by sintering the low temperature co-fired ceramic material, and a multilayer ceramic substrate manufactured using the low temperature co-fired ceramic material.

According to preferred embodiments of the present invention, a low temperature co-fired ceramic material includes a $SiO_2$—$BaO$—$Al_2O_3$-based primary component, and, as secondary components, 0.044 to 0.077 parts by weight of iron in terms of $Fe_2O_3$ and 0.30 to 0.55 parts by weight of zirconium in terms of $ZrO_2$ relative to 100 parts by weight of the $SiO_2$—$BaO$—$Al_2O_3$-based primary component.

In the low temperature co-fired ceramic material, preferably, the $SiO_2$—$BaO$—$Al_2O_3$-based primary component includes 47% to 60% by weight of $SiO_2$, 20% to 42% by weight of $BaO$, and 5% to 30% by weight of $Al_2O_3$.

According to preferred embodiments of the present invention, a low temperature co-fired ceramic body is obtained by firing the low temperature co-fired ceramic material described above at a temperature of 1,050° C. or lower.

According to preferred embodiments of the present invention, a multilayer ceramic substrate includes a laminated body formed by stacking a plurality of ceramic layers, in which at least one layer of the plurality of ceramic layers is composed of the low temperature co-fired ceramic body described above.

Preferably, the multilayer ceramic substrate further includes a conductor pattern provided on a surface and/or in an inside of the laminated body, the conductor pattern being composed of a copper-based material.

In the low temperature co-fired ceramic material according to preferred embodiments of the present invention, predetermined amounts of iron and zirconium, as secondary components which serve as sintering aids, are added to the $SiO_2$—$BaO$—$Al_2O_3$-based primary component, and the amounts of iron and zirconium are strictly controlled. As a result, the multilayer ceramic substrate constituted by using the low temperature co-fired ceramic body formed by sintering the low temperature co-fired ceramic material can have advantages, such as high dimensional accuracy, good plating adhesion, high bond strength of the surface conductor film to the substrate, high strength (flexural strength or bending strength) of the substrate itself, small warpage and waviness, and high substrate density (good electrical properties).

In particular, when the $SiO_2$—$BaO$—$Al_2O_3$-based primary component has a composition including 47% to 60% by weight of $SiO_2$, 20% to 42% by weight of $BaO$, and 5% to 30% by weight of $Al_2O_3$, the advantages described above can be more satisfactorily and reliably attained.

Other features, elements, characteristics and advantages of the present invention will become more apparent from the following detailed description of preferred embodiments of the present invention with reference to the attached drawing.

BRIEF DESCRIPTION OF THE DRAWING

FIG. 1 is a cross-sectional view illustrating a multilayer ceramic substrate manufactured using a low temperature co-fired ceramic material according to an embodiment of the present invention.

DESCRIPTION OF THE PREFERRED EMBODIMENTS

An example of a multilayer ceramic substrate, to which the present invention is applied, will be described with reference to FIG. 1.

A multilayer ceramic substrate 1 shown in FIG. 1 includes a laminated body 3 in which a plurality of ceramic layers 2 are stacked. In the laminated body 3, various conductor patterns are provided on specific ceramic layers 2.

Examples to the conductor patterns include external conductor films 4 and 5 disposed on end faces in the stacking direction of the laminated body 3, internal conductor films 6 disposed along specific interfaces between the ceramic layers 2, and via hole conductors 7 disposed so as to penetrate specific ceramic layers 2.

The external conductor films 4 on the upper side are used for connection to electronic components 8 and 9 to be mounted on the outer surface of the laminated body 3. FIG. 1 shows electronic components 8 provided with bump electrodes 10, such as semiconductor devices, and an electronic component 9 provided with planar terminal electrodes 11, such as a chip capacitor.

Furthermore, the external conductor films 5 on the lower side are used for connection to a mother board (not shown) on which the multilayer ceramic substrate 1 is mounted.

The laminated body 3 included in the multilayer ceramic substrate 1 is obtained by firing a green laminated body which includes a plurality of ceramic green layers, which will form the ceramic layers 2, stacked together and internal conductor films 6 and via hole conductors 7 composed of conductive pastes, and in some cases, further includes external conductor films 4 and 5 composed of conductive pastes.

The stacked structure of the ceramic green layers in the green laminated body is typically obtained by stacking a plurality of ceramic green sheets obtained by shaping a ceramic slurry, and the conductor patterns, in particular, the internal conductor patterns, are provided on ceramic green sheets before being stacked.

The ceramic slurry can be obtained by adding an organic binder such as polyvinyl butyral, a solvent such as toluene or ethanol, a plasticizer such as di-n-butyl phthalate, and as necessary, an additive, such as a dispersing agent, to a low temperature co-fired ceramic material having a composition which is characteristic to the embodiment, which will be described below, followed by mixing.

In the shaping process to obtain the ceramic green sheets using the ceramic slurry, for example, the ceramic slurry is formed into sheets on a carrier film composed of an organic resin, such as polyethylene terephthalate, using a doctor blade method.

In the process of providing the conductor patterns on the ceramic green sheets, preferably, a conductive paste containing copper as a main conductive component is used, through-holes for the via hole conductors 7 are formed in the ceramic green sheets, the through-holes are filled with the conductive paste, and conductive paste films for the internal conductor films 6, and as necessary, conductive paste films for the external conductor films 4 and 5 are formed, for example, by a screen printing method.

The ceramic green sheets are stacked in a predetermined order and subjected to pressure bonding in the stacking direction, for example, at a pressure of 1,000 kgf/cm$^2$ to obtain a green laminated body.

Although not shown in the drawing, the green laminated body may be provided with cavities for receiving other electronic components, and joint portions for fixing a cover that covers the electronic components 8 and 9, and the like.

The green laminated body is fired in a temperature range from a temperature at which the low temperature co-fired ceramic material contained in the ceramic green layers can be sintered, or higher, for example, 900° C. or higher, to a temperature that is equal to or lower than the melting point of the metal contained in the conductor patterns, for example, 1,050° C. or lower in the case of copper or gold.

Furthermore, in the case where the metal contained in the conductor patterns is copper, firing is performed in a non-oxidizing atmosphere, such as a nitrogen atmosphere, binder removal is completed at a temperature of 900° C. or lower, and the oxygen partial pressure is decreased during the temperature decreasing period such that copper is not substantially oxidized at the time of completion of firing.

When the firing temperature is, for example, 980° C. or higher, although silver is not used as the metal contained in the conductor patterns, an Ag—Pd-based alloy including 20% by weight or more of palladium can be used. In this case, firing can be carried out in the air.

When the firing temperature is, for example, 950° C. or lower, silver can be used as the metal contained in the conductor patterns.

When the firing step is finished as described above, a laminated body 3 shown in FIGURE is obtained.

Then, as necessary, external conductor films 4 and/or 5 are formed, electronic components 8 and 9 are mounted on the laminated body 3. Thereby, a multilayer ceramic substrate 1 shown in FIG. 1 is completed.

A low temperature co-fired ceramic material which includes a $SiO_2$—BaO—$Al_2O_3$-based primary component and, as secondary components, 0.044 to 0.077 parts by weight of iron in terms of $Fe_2O_3$ and 0.30 to 0.55 parts by weight of zirconium in terms of $ZrO_2$ relative to 100 parts by weight of the $SiO_2$—BaO—$Al_2O_3$-based primary component is used as the low temperature co-fired ceramic material contained in the ceramic slurry described above.

By strictly controlling the amounts of iron and zirconium, as the secondary components, to the predetermined ranges as described above, the following effects are demonstrated.

(1) A state in which, because of excessive firing shrinkage of ceramic, the size of the multilayer ceramic substrate 1 becomes smaller than the design value (excessively sintered state), or a state in which, because of insufficient firing shrinkage (densification), the size of the multilayer ceramic substrate 1 becomes larger than the design value (insufficiently sintered state) is prevented.

(2) A state in which glass (produced with the reaction of the primary component during firing) exudes to front and back surfaces of the multilayer ceramic substrate 1 and the surface of the external conductor films 4 and 5 on the front surface of the multilayer ceramic substrate 1 (excessively sintered state) is prevented, thus avoiding a decrease in plating adhesion on the external conductor films 4 and 5 or a decrease in peel resistance of the external conductor films 4 and 5.

(3) A state in which $SiO_2$ (quartz) in the primary component undergoes a phase transition to cristobalite, thus decreasing the strength of the multilayer ceramic substrate 1 (excessively sintered state) is prevented.

(4) A state in which, in a mother board (from which a plurality of multilayer ceramic substrates 1 as a plurality of daughter boards are separated and which includes a daughter board region where a plurality of daughter boards are arranged in a grid pattern and an edge portion surrounding the daughter board region), waviness is caused by sintering, and in particular, warpage occurs locally in the edge portion (insufficiently sintered state) is prevented.

(5) A state in which the ceramic layers 2 and the conductor patterns, such as the conductor films 4 to 6 and the via hole conductors 7, are not densified, and voids occur (insufficiently sintered state) is prevented.

For the reasons described above, the resulting multilayer ceramic substrate 1 has advantages, such as high dimensional accuracy, good plating adhesion, high bond strength of the surface conductor film to the substrate, high strength (flexural strength or bending strength) of the substrate itself, small warpage and waviness, and high substrate density (good electrical properties).

In particular, when the $SiO_2$—BaO—$Al_2O_3$-based primary component has a composition including 47% to 60% by weight of $SiO_2$, 20% to 42% by weight of BaO, and 5% to 30% by weight of $Al_2O_3$, the advantages described above can be more satisfactorily and reliably attained.

Furthermore, the low temperature co-fired ceramic body obtained by firing the low temperature co-fired ceramic material according to preferred embodiments of the present invention may be used for constituting only one ceramic layer 2 in the multilayer ceramic substrate 1 provided with the laminated body 3 having a stacked structure as the one described above.

Furthermore, the low temperature co-fired ceramic material according to preferred embodiments of the present invention may be applied not only to a multilayer ceramic substrate including a laminated body having a stacked structure such as the one described above, but also to a ceramic substrate having a single-layer structure including only one ceramic layer.

An example of an experiment carried out to confirm the advantages of the present invention will now be described.

Experimental Example 1

First, as starting material powders for the primary component of a low temperature co-fired ceramic material, $SiO_2$, $BaCO_3$, and $Al_2O_3$ powders, each having an average particle size (D50) of 2.0 μm or less, were prepared. Next, the starting material powders were weighed so as to satisfy the compositions shown under the column titled "Primary component" in Table 1. Furthermore, $Fe_2O_3$ as the secondary component was made to adhere to the surface of the $SiO_2$ powder in advance so as to satisfy the amount shown under the column titled "Additive component" in Table 1.

Next, a mixed powder obtained by mixing the starting material powders was calcined at a temperature of 800° C. to 1,000° C. The resulting calcine was pulverized, and during the pulverization, a $ZrO_2$ powder was added thereto in the amount shown under the column titled "Additive component" in Table 1. Thereby, a low temperature co-fired ceramic material powder for each sample was obtained.

In Table 1, $SiO_2$, $BaCO_3$, and $Al_2O_3$ constituting the primary component are expressed in % by weight, and the total thereof is 100% by weight. Meanwhile, $Fe_2O_3$ and $ZrO_2$, which are additive components, are expressed in parts by weight relative to 100 parts by weight of the primary component.

Next, polyvinyl butyral as an organic binder, ethyl alcohol as a solvent, and dioctyl phthalate as a plasticizer were added to the low temperature co-fired ceramic material powder for each sample, and wet mixing was performed, followed by defoaming under reduced pressure to obtain a ceramic slurry.

Next, the ceramic slurry was formed into a sheet using a doctor blade method, followed by drying. The resulting sheet was cut to an appropriate size. Thereby, ceramic green sheets with a thickness of 50 μm were obtained.

Next, a conductive paste was screen-printed on the ceramic green sheets to form conductive paste films. The conductive paste used was prepared by dispersing a metal powder containing copper as a main component together with an organic binder in a solvent and forming the dispersion into a paste.

Next, the ceramic green sheets were cut into a predetermined size. Ten of the ceramic green sheets were stacked and subjected to pressure bonding to obtain a green laminated body for a mother board.

Next, by firing the green laminated body in a non-oxidizing atmosphere at a temperature of 950° C. to 1,000° C., a mother board for each sample was obtained in which the ceramic green sheets and the conductive paste films had been sintered. Note that, by dividing the mother board, a plurality of multilayer ceramic substrates can be obtained.

As shown in Table 1, dimensional accuracy, plating adhesion, strength of conductor film, substrate strength, warpage/waviness, and substrate density were evaluated, on each sample thus obtained. The evaluation methods are as follows:

Dimensional Accuracy

The shrinkage in the X-Y plane direction due to sintering of the resulting mother board was measured, and it was checked whether or not the measured value satisfied a control standard (center value of the standard for shrinkage: for example, ±0.6%) in the mother board process flow after mounting.

When 95% or more of the measured shrinkages satisfied the control standard, the sample was evaluated to be good (○); when 80% or more and less than 95% of the measured shrinkages satisfied the control standard, the sample was evaluated to be average (Δ); and when less than 80% of the measured shrinkages satisfied the control standard, the sample was evaluated to be poor (x).

Plating Adhesion

The co-fired copper-based conductor film on the surface of the mother board was subjected to nickel plating and gold plating, and the appearance of the plating state was observed. When 95% or more of the area of the copper-based conductor film were covered with the nickel/gold plating film, the sample was evaluated to be good (○); when 85% or more and less than 95% of the area of the copper-based conductor film were covered with the nickel/gold plating film, the sample was evaluated to be average (Δ); and when less than 85% of the area of the copper-based conductor film were covered with the nickel/gold plating film, the sample was evaluated to be poor (x).

Strength of Conductor Film

A metal bar was joined by soldering to the co-fired copper-based conductor film on the surface of the mother board, and the 90-degree peel test (JIS Z0237) was carried out. When no peeling occurred in 95% or more of the junctions, the sample was evaluated to be good (○); when no peeling occurred in 85% or more and less than 95% of the junctions, the sample was evaluated to be average (Δ); and when no peeling occurred in less than 85% of the junctions only, the sample was evaluated to be poor (x).

Substrate Strength

The flexural strength of a test piece taken from the mother board was measured in accordance with JIS R1601. When the flexural strength was 220 MPa or more, the sample was evaluated to be good (○); when the flexural strength was 180 MPa or more and less than 220 MPa, the sample was evaluated to be average (Δ); and when the flexural strength was less than 180 MPa, the sample was evaluated to be poor (x).

Warpage/Waviness

The warpage in the entire mother board and the local warpage in the edge portion of the mother board were measured, and it was checked whether or not the measured values satisfied a process control standard. When 95% or more of the measured values satisfied the control standard, the sample was evaluated to be good (○); when 80% or more and less than 95% of the measured values satisfied the control standard, the sample was evaluated to be average (Δ); and when less than 80% of the measured values satisfied the control standard, the sample was evaluated to be poor (x).

Substrate Density

The density of a test piece taken from the mother board was measured by the Archimedean method. When the measured density was 98% or more of the standard density, the sample was evaluated to be good (○); when the measured density was 95% or more and less than 98% of the standard density, the sample was evaluated to be average (Δ); and when the measured density was less than 95% of the standard density, the sample was evaluated to be poor (x).

TABLE 1

| Sample No. | Primary component (wt. %) | | | Additive component (parts by weight) | | Evaluation results | | | | | |
|---|---|---|---|---|---|---|---|---|---|---|---|
| | $SiO_2$ | BaO | $Al_2O_3$ | $Fe_2O_3$ | $ZrO_2$ | Dimensional accuracy | Plating adhesion | Strength of conductor film | Substrate strength | Warpage/ waviness | Substrate density |
| 1  | 55.0 | 30.0 | 15.0 | 0.040 | 0.40 | X | ○ | ○ | ○ | X | Δ |
| 2  | 55.0 | 30.0 | 15.0 | 0.044 | 0.40 | ○ | ○ | ○ | ○ | ○ | ○ |
| 3  | 55.0 | 30.0 | 15.0 | 0.050 | 0.40 | ○ | ○ | ○ | ○ | ○ | ○ |
| 4  | 55.0 | 30.0 | 15.0 | 0.060 | 0.40 | ○ | ○ | ○ | ○ | ○ | ○ |
| 5  | 55.0 | 30.0 | 15.0 | 0.070 | 0.40 | ○ | ○ | ○ | ○ | ○ | ○ |
| 6  | 55.0 | 30.0 | 15.0 | 0.077 | 0.40 | ○ | ○ | ○ | ○ | ○ | ○ |
| 7  | 55.0 | 30.0 | 15.0 | 0.080 | 0.40 | Δ | X | X | X | ○ | X |
| 8  | 55.0 | 30.0 | 15.0 | 0.060 | 0.25 | X | ○ | ○ | X | X | ○ |
| 9  | 55.0 | 30.0 | 15.0 | 0.066 | 0.30 | ○ | ○ | ○ | ○ | ○ | ○ |
| 10 | 55.0 | 30.0 | 15.0 | 0.060 | 0.50 | ○ | ○ | ○ | ○ | ○ | ○ |
| 11 | 55.0 | 30.0 | 15.0 | 0.060 | 0.55 | ○ | ○ | ○ | ○ | ○ | ○ |
| 12 | 55.0 | 30.0 | 15.0 | 0.060 | 0.60 | Δ | X | X | X | ○ | ○ |
| 13 | 55.0 | 30.0 | 15.0 | 0.040 | 0.25 | X | ○ | ○ | X | X | Δ |
| 14 | 55.0 | 30.0 | 15.0 | 0.080 | 0.60 | Δ | X | X | X | ○ | X |
| 15 | 44.8 | 36.4 | 18.8 | 0.060 | 0.40 | Δ | ○ | Δ | Δ | ○ | Δ |
| 16 | 40.0 | 40.0 | 20.0 | 0.060 | 0.40 | ○ | ○ | ○ | ○ | ○ | ○ |
| 17 | 60.0 | 25.5 | 14.5 | 0.060 | 0.40 | ○ | ○ | ○ | ○ | ○ | ○ |
| 18 | 62.5 | 25.0 | 12.5 | 0.060 | 0.40 | Δ | Δ | Δ | ○ | ○ | Δ |
| 19 | 60.0 | 17.6 | 22.4 | 0.060 | 0.40 | Δ | ○ | Δ | ○ | ○ | Δ |
| 20 | 60.0 | 20.0 | 20.0 | 0.060 | 0.40 | ○ | ○ | ○ | ○ | ○ | ○ |
| 21 | 50.0 | 42.0 | 8.0  | 0.060 | 0.40 | ○ | ○ | ○ | ○ | ○ | ○ |
| 22 | 44.0 | 44.0 | 12.0 | 0.060 | 0.40 | ○ | Δ | ○ | ○ | ○ | ○ |
| 23 | 58.8 | 37.8 | 3.4  | 0.060 | 0.40 | Δ | ○ | ○ | Δ | ○ | ○ |
| 24 | 60.0 | 35.0 | 5.0  | 0.060 | 0.40 | ○ | ○ | ○ | ○ | ○ | ○ |
| 25 | 47.0 | 23.0 | 30.0 | 0.060 | 0.40 | ○ | ○ | ○ | ○ | ○ | ○ |
| 26 | 44.0 | 24.0 | 32.0 | 0.060 | 0.40 | Δ | ○ | Δ | ○ | ○ | Δ |

As shown in Table 1, Sample Nos. 2 to 6, 9 to 11, and 15 to 26 satisfy the condition of containing 0.044 to 0.077 parts by weight of $Fe_2O_3$ and 0.30 to 0.55 parts by weight of $ZrO_2$ relative to 100 parts by weight of the $SiO_2$—BaO—$Al_2O_3$-based primary component and are within the range of the present invention. The dimensional accuracy, the plating adhesion, the strength of conductor film, the substrate strength, the warpage/waviness, and the substrate density are evaluated to be good (○) or average (Δ).

In Sample Nos. 2 to 6, 9 to 11, 16, 17, 20, 21, 24, and 25, which are within the range of the present invention and which further satisfy the condition that the $SiO_2$—BaO—$Al_2O_3$-based primary component includes 47% to 60% by weight of $SiO_2$, 20% to 42% by weight of BaO, and 5% to 30% by weight of $Al_2O_3$, the dimensional accuracy, the plating adhesion, the strength of conductor film, the substrate strength, the warpage/waviness, and the substrate density are evaluated to be good (○).

In Sample No. 15, which is within the range of the present invention but the content of $SiO_2$ in the $SiO_2$—BaO—$Al_2O_3$-based primary component is less than 47% by weight, the dimensional accuracy, the strength of conductor film, the substrate strength, and the substrate density are evaluated to be average (Δ). On the other hand, in Sample No. 18, where the content of $SiO_2$ is more than 60% by weight, the dimensional accuracy, the plating adhesion, the strength of conductor film, and the substrate density are evaluated to be average (Δ).

Furthermore, in Sample No. 19, which is within the range of the present invention but the content of BaO in the $SiO_2$—BaO—$Al_2O_3$-based primary component is less than 20% by weight, the dimensional accuracy, the strength of conductor film, the substrate strength, and the substrate density are evaluated to be average (Δ). On the other hand, in Sample No. 22, where the content of BaO is more than 42% by weight, the plating adhesion is evaluated to be average (Δ).

Furthermore, in Sample No. 23, which is within the range of the present invention but the content of $Al_2O_3$ in the $SiO_2$—BaO—$Al_2O_3$-based primary component is less than 5% by weight, the dimensional accuracy and the substrate strength are evaluated to be average (Δ). On the other hand, in Sample No. 26, where the content of $Al_2O_3$ is more than 30% by weight, the dimensional accuracy, the strength of conductor film, and the substrate density are evaluated to be average (Δ).

In contrast, in sample No. 1, which is out of the range of the present invention since the amount of $Fe_2O_3$ as the additive component is less than 0.044 parts by weight, the dimensional accuracy and the warpage/waviness are evaluated to be poor (x), and the substrate density is evaluated to be average (Δ). In Sample No. 7, where the amount of $Fe_2O_3$ as the additive component is more than 0.077 parts by weight, the plating adhesion, the strength of conductor film, the substrate strength, and the substrate density are evaluated to be poor (x), and the dimensional accuracy is evaluated to be average (Δ).

In Sample No. 8, which is out of the range of the present invention since the amount of $ZrO_2$ as the additive component is less than 0.30 parts by weight, the dimensional accuracy, the substrate strength, and the warpage/waviness are evaluated to be poor (x). In Sample No. 12, where the amount of $ZrO_2$ as the additive component is more than 0.55 parts by weight, the plating adhesion, the strength of conductor film, and the substrate strength are evaluated to be poor (x), and the dimensional accuracy is evaluated to be average (Δ).

In Sample No. 13, which is out of the range of the present invention since the amount of $Fe_2O_3$ as the additive component is less than 0.044 parts by weight and the amount of $ZrO_2$ as the additive component is less than 0.30 parts by weight, the dimensional accuracy, the substrate strength, and the warpage/waviness are evaluated to be poor (x), and the substrate density is evaluated to be average (Δ).

In Sample No. 14, which is out of the range of the present invention since the amount of $Fe_2O_3$ as the additive component is more than 0.077 parts by weight and the amount of $ZrO_2$ as the additive component is more than 0.55 parts by weight, the plating adhesion, the strength of conductor film, the substrate strength, and the substrate density are evaluated to be poor (x), and the dimensional accuracy is evaluated to be average (Δ).

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A low temperature co-firable ceramic material comprising:
    a $SiO_2$—$BaO$—$Al_2O_3$-based primary component; and
    as secondary components, 0.044 to 0.077 parts by weight of iron in terms of $Fe_2O_3$ and 0.30 to 0.55 parts by weight of zirconium in terms of $ZrO_2$ relative to 100 parts by weight of the $SiO_2$—$BaO$—$Al_2O_3$-based primary component;
    wherein the $SiO_2$—$BaO$—$Al_2O_3$-based primary component includes 47% to 60% by weight of $SiO_2$, 20% to 42% by weight of BaO, and 5% to 30% by weight of $Al_2O_3$.

2. The low temperature co-firable ceramic material according to claim 1, wherein the amounts of secondary components are 0.050 to 0.070 parts by weight of iron in terms of $Fe_2O_3$ and 0.40 to 0.50 parts by weight of zirconium in terms of $ZrO_2$ relative to 100 parts by weight of the $SiO_2$—$BaO$—$Al_2O_3$-based primary component.

3. A low temperature co-fired ceramic body which is a fired low temperature co-firable ceramic material according to claim 2.

4. A method of making a low temperature co-fired ceramic body comprising firing a low temperature co-firable ceramic material according to claim 2 at a temperature of 1,050° C. or lower.

5. A low temperature co-fired ceramic body which is a fired low temperature co-firable ceramic material according to claim 1.

6. A multilayer ceramic substrate comprising a laminated body comprising a plurality of stacked ceramic layers, in which at least one layer of the plurality of ceramic layers is composed of the low temperature co-fired ceramic body according to claim 5.

7. The multilayer ceramic substrate according to claim 6, further comprising a conductor pattern provided on a surface or in an inside of the laminated body or both, wherein the conductor pattern comprises copper.

8. The multilayer ceramic substrate according to claim 7, wherein the amounts of secondary components are 0.050 to 0.070 parts by weight of iron in terms of $Fe_2O_3$ and 0.40 to 0.50 parts by weight of zirconium in terms of $ZrO_2$ relative to 100 parts by weight of the $SiO_2$—$BaO$—$Al_2O_3$-based primary component.

9. The multilayer ceramic substrate according to claim 6, wherein the amounts of secondary components are 0.050 to 0.070 parts by weight of iron in terms of $Fe_2O_3$ and 0.40 to 0.50 parts by weight of zirconium in terms of $ZrO_2$ relative to 100 parts by weight of the $SiO_2$—$BaO$—$Al_2O_3$-based primary component.

10. A method of making a low temperature co-fired ceramic body comprising firing a low temperature co-firable ceramic material according to claim 1 at a temperature of 1,050° C. or lower.

* * * * *